United States Patent [19]

Tanaka

[11] Patent Number: 5,446,429
[45] Date of Patent: Aug. 29, 1995

[54] PIEZOELECTRIC VIBRATOR FOR REDUCTION OF UNDESIRED VIBRATIONS

[75] Inventor: Mitsuru Tanaka, Kyoto, Japan
[73] Assignee: Murata Mfg. Co., Ltd., Japan
[21] Appl. No.: 44,960
[22] Filed: Apr. 8, 1993
[51] Int. Cl.⁶ ............................................... H03H 4/00
[52] U.S. Cl. .................................... 333/187; 333/188; 333/189; 310/326; 310/366
[58] Field of Search ............... 333/187, 188, 189, 190, 333/191, 192; 310/326, 363, 364, 365, 366, 367, 368

[56] References Cited

U.S. PATENT DOCUMENTS

| | | | |
|---|---|---|---|
| 4,066,986 | 1/1978 | Takano | 333/188 |
| 4,870,313 | 9/1989 | Hirama et al. | 310/320 |
| 5,075,651 | 12/1991 | Pradal | 333/191 |

FOREIGN PATENT DOCUMENTS

| | | |
|---|---|---|
| 4103208 | 4/1992 | Japan . |
| 4207307 | 7/1992 | Japan . |

Primary Examiner—Robert J. Pascal
Assistant Examiner—Darius Gambino
Attorney, Agent, or Firm—Ostrolenk, Faber, Gerb & Soffen

[57] ABSTRACT

An earth electrode is formed on a first major surface of a piezoelectric substrate, so as to be opposed to both of first and second excitation electrodes which are formed on a second major surface of the piezoelectric substrate. An earth terminal electrode, which is connected to the earth electrode is prevented from overlapping with a lead line which connects the first excitation electrode with a terminal electrode. An electric insulating film is formed in a position opposed to the lead line. Accordingly, if a conductive adhesive, which is employed for connecting the earth terminal electrode to another electrode, spreads beyond the earth terminal electrode, the lead line is not overlapped with the earth terminal electrode or the conductive adhesive through the piezoelectric substrate. In consequence, it is possible to prevent undesirable vibration of piezoelectric substrate in portions other than between the excitation electrodes and the earth electrode. Thus, it is possible to improve a demodulation distortion factor characteristic in a discriminator, for example.

2 Claims, 6 Drawing Sheets

F/G.8

PIEZOELECTRIC VIBRATOR FOR REDUCTION OF UNDESIRED VIBRATIONS

BACKGROUND OF THE INVENTION

1. Field of the Invention

The present invention relates to a piezo-resonator utilizing thickness shear vibration, and more particularly, it relates to an improvement for attaining improved electric characteristics in such a piezo-resonator.

2. Description of the Background Art

FIG. 11 shows a conventional elongated rectangular piezo-resonator 101 forming a ceramic discriminator utilizing thickness shear vibration, which is of interest to the present invention.

The piezo-resonator 101 comprises an elongated rectangular piezoelectric substrate 102. Referring to FIG. 11, solid lines show elements which are formed on a first major surface of the piezoelectric substrate 102, while broken lines show those formed on a second major surface, respectively.

On the first major surface of the piezoelectric substrate 102, first and second excitation electrodes 103 and 104 are arranged along the longitudinal direction of the piezoelectric substrate 102. The second excitation electrode 104 is closer to a first longitudinal end portion 105 of the piezoelectric substrate 102 than the first excitation electrode 103, while both of the first and second excitation electrodes 103 and 104 are closer to the first end portion 105 than a longitudinal central portion of the piezoelectric substrate 102.

Furthermore, on the first major surface of the piezoelectric substrate 102, a first terminal electrode 107 is formed on a second longitudinal end portion 108 of the piezoelectric substrate 102, and connected to the first excitation electrode 103 through a first lead line 106, which passes through the longitudinal central portion of the piezoelectric substrate 102. A second terminal electrode 110 is formed on the first longitudinal end portion 105 of the piezoelectric substrate 102, and connected to the second excitation electrode 104 through a second lead line 109.

On the second major surface of the piezoelectric substrate 102, an earth electrode 111 is formed so as to be simultaneously opposed to both of the first and second excitation electrodes 103 and 104. An earth terminal electrode 113 is formed on the longitudinal central portion of the piezoelectric substrate 102 and connected to the earth electrode 111 through an earth lead line 112, as shown by the broken lines in FIG. 11.

In the piezo-resonator 101 having the aforementioned structure, the opposed portions of the first and second excitation electrodes 103 and 104 and the earth electrode 111 are adapted so as to vibrate.

In the aforementioned piezo-resonator 101, however, not only the excitation electrodes 103 and 104 and the earth electrode 111, but also the first lead line 106 and the earth terminal electrode 113 are opposed to each other through the piezoelectric substrate 102.

Such a piezo-resonator 101 is generally obtained by forming conductor films which define the excitation electrodes 103 and 104, the earth electrode 111, the lead lines 106, 109 and 112 and the terminal electrodes 107, 110 and 113, on a polarized mother piezoelectric substrate and thereafter cutting the mother piezoelectric substrate. The long edges of the piezoelectric substrate 102, shown in FIG. 11, are provided as a result of such cutting. According to this manufacturing method, the conductor film which defines the earth terminal electrode 113 is generally formed to extend in the form of a strip on the mother piezoelectric substrate, in a similar manner to the remaining conductor films which define the excitation electrodes 103 and 104, the earth electrode 111 and the first and second terminal electrodes 107 and 108. In the piezo-resonator 101 obtained by such cutting, therefore, the earth terminal electrode 113 is partially opposed to the first lead line 106.

Such an overlap of the earth terminal electrode 113 and the first lead line 106 results in vibration in this portion. Such undesired vibration causes a ripple effect in a demodulation distortion factor characteristic, so as to reduce the demodulation distortion factor characteristic.

Under the present circumstances, the aforementioned undesired vibration is damped by solder which is employed for mounting a lead terminal on the earth terminal electrode 113. However, due to dispersion in the amount of solder and in the soldering area, it is difficult to reliably damp such undesired vibration.

SUMMARY OF THE INVENTION

Accordingly, an object of the present invention is to provide a piezo-resonator having improved electric characteristics, which can solve the aforementioned problem.

The present invention is directed to a piezo-resonator utilizing thickness shear vibration, which comprises a longitudinal rectangular piezoelectric substrate; first and second excitation electrodes formed on a first major surface of the piezoelectric substrate so as to be closer to a first longitudinal end portion of the piezoelectric substrate than a prescribed portion in the longitudinal direction thereof; a first lead line passing through the prescribed portion of the piezoelectric substrate and extending toward a second longitudinal end portion thereof, the first lead line being connected to the first excitation electrode; a second lead line extending toward the first longitudinal end portion of the piezoelectric substrate, the second lead line being connected to the second excitation electrode; an earth electrode formed on a second major surface of the piezoelectric substrate so as to be simultaneously opposed to both of the first and second excitation electrodes; and an earth terminal electrode formed on the second major surface of the piezoelectric substrate in the prescribed portion to be connected to the earth electrode through an earth lead line. In order to solve the aforementioned technical problem, the earth terminal electrode is removed from a portion of the second major surface opposite to the first lead line.

According to the present invention, the earth terminal electrode is removed in a portion opposite to the first lead line so that the earth terminal electrode and the first lead line are not opposed to each other and are prevented from forming a vibrating portion therebetween.

According to the present invention, therefore, it is possible to suppress undesired vibration caused by the overlapping of the earth terminal electrode and the first lead line.

Thus, it is possible to improve electric characteristics, such as demodulation distortion factor characteristic in a discriminator, for example.

Due to such an improvement of electric characteristics, it is not necessary to damp the undesired vibration by solder, which is easily dispersed in amount and area as described above, whereby improvement in production yield of the piezo-resonator can be expected.

In particular, when such a piezo-resonator is connected with another electric element not by solder but by a conductive adhesive, it is of particular importance that the earth terminal electrode and the first lead line be prevented from overlapping so as to suppress undesired vibration, since the conductive adhesive is not as effective in damping as solder.

According to the present invention, an electric insulating film is preferably formed to replace the removed portion of the earth terminal electrode. When the portion of the second major surface from which the earth terminal electrode is removed is provided with such an electric insulating film, it is possible to prevent the conductive adhesive, which is applied onto the earth terminal electrode, from extending toward a surface portion of the piezoelectric substrate that is opposite to the first lead line. Thus, it is possible to prevent the effect of such partial removal of the earth terminal electrode from being reduced by the conductive adhesive.

The foregoing and other objects, features, aspects and advantages of the present invention will become more apparent from the following detailed description of the present invention when taken in conjunction with the accompanying drawings.

DESCRIPTION OF THE PREFERRED EMBODIMENTS

Figure 1:
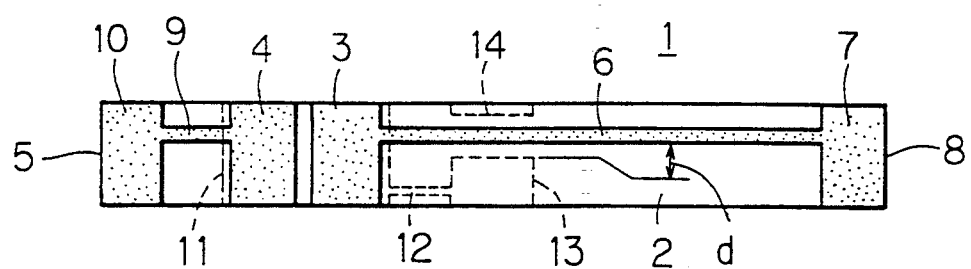
FIG. 1 is a plan view showing a piezo-resonator 1 according to an embodiment of the present invention.

FIG. 1 illustrates a piezo-resonator 1 according to an embodiment of the present invention, which forms a discriminator utilizing thickness shear vibration. This piezo-resonator 1 comprises an elongated rectangular piezoelectric substrate 2, similar to the conventional piezo-resonator 101 shown in FIG. 11. Also in FIG. 1, solid lines show elements which are formed on the first major surface of the piezoelectric substrate 2, while broken lines show those formed on a second major surface.

First and second excitation electrodes 3 and 4 are arranged on the first major surface of the piezoelectric substrate 2 along the longitudinal direction thereof, for example. The second excitation electrode 4 is closer to a first longitudinal end portion 5 of the piezoelectric substrate 2 than the first excitation electrode 3, while both of these first and second excitation electrodes 3 and 4 are closer to the first end portion 5 than a prescribed portion in the longitudinal direction of the piezoelectric substrate 2, i.e., a longitudinal central portion according to this embodiment.

On the first major surface of the piezoelectric substrate 2, a first terminal electrode 7 is formed on a second longitudinal end portion 8 of the piezoelectric substrate 2 and connected to the first excitation electrode 3 through a first lead line 6 which passes through the longitudinal central portion of the piezoelectric substrate 2, while a second terminal electrode 10 is formed on the first longitudinal end portion 5 of the piezoelectric substrate 2 and connected to the second excitation electrode 4 through a second lead line 9.

On the second major surface of the piezoelectric substrate 2, on the other hand, an earth electrode 11 is formed so as to be simultaneously opposed to both of the first and second excitation electrodes 3 and 4. An earth lead line 12 is drawn out from the earth electrode 11.

The elements of the piezo-resonator 1 heretofore described are substantially similar to those of the aforementioned conventional piezo-resonator 101. A structure specific to the piezo-resonator 1 according to this embodiment of the present invention is now described.

Figure 11:
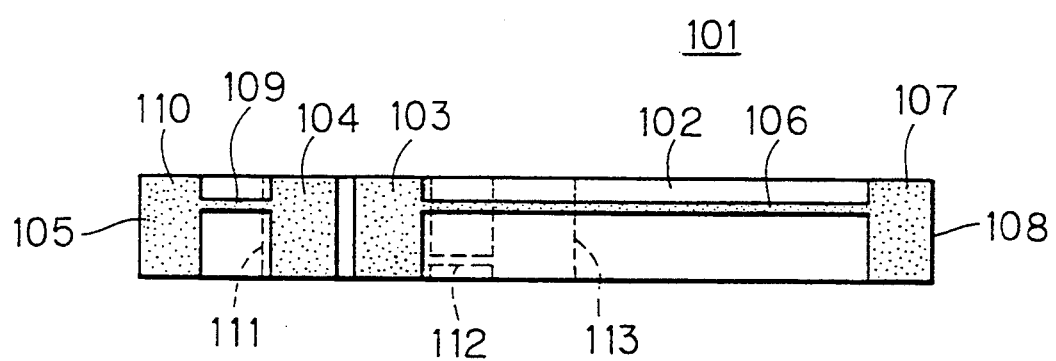
FIG. 11 is a plan view showing a conventional piezo-resonator 101.

While an earth terminal electrode 13 is formed on the longitudinal central portion of the piezoelectric substrate 2 and connected to the earth electrode 11 through the earth lead line 12, as in the conventional piezo-resonator 101 shown in FIG. 11, this earth terminal electrode 13 is removed in a portion opposed to the first lead line 6. A dummy electrode 14, which is formed in line with the earth terminal electrode 13 along the direction of width of the piezoelectric substrate 2, is provided by a conductor film which is in series with an earth terminal electrode formed in an adjacent piezo-resonator when a mother piezoelectric substrate is cut, as described above, to obtain the piezo-resonator 1. Therefore, this dummy electrode 14 has no specific function in the piezo-resonator 1, and may not be formed therein, as a matter of course.

The piezoelectric substrate 2 is 1.00 mm by 7.8 mm, for example. On the other hand, the earth terminal electrode 13 has a lateral dimension of 0.8 mm, and a vertical dimension which depends on that of the piezoelectric substrate 2. Regardless of such dimensions, a distance d on a plane between the first lead line 6 and the earth terminal electrode 13 is preferably at least 0.1 mm. According to an experiment conducted, it is possible to substantially completely suppress undesired vibration caused by overlapping of the first lead line 6 and the earth terminal electrode 13 when the distance d is selected in such a manner. More preferably, the distance d is set to be at least 0.2 mm, in consideration of the accuracy in formation of the earth terminal electrode 13 and the like.

According to the piezo-resonator 1 shown in FIG. 1, the earth terminal electrode 13 is removed in the portion opposed to the first lead line 6, whereby the earth terminal electrode 13 does not oppose the first lead line 6 so that formation of an undesired vibrating portion therebetween is prevented. Therefore, it is possible to improve electric characteristics such as a demodulation distortion factor characteristic in a discriminator, for example.

When the piezo-resonator 1, shown in FIG. 1, is directed to a specific use, however, the aforementioned advantage may not be sufficiently effectuated, as hereafter described with reference to FIGS. 2 to 5.

Figure 2:
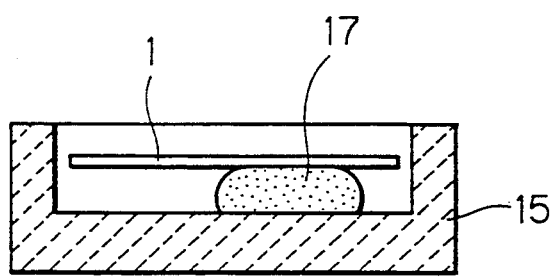
FIG. 2 is a sectional view showing a state of the piezoelectric resonator 1 shown in FIG. 1, which is inserted in a case 15 provided with a conductive adhesive 17.
Figure 3:
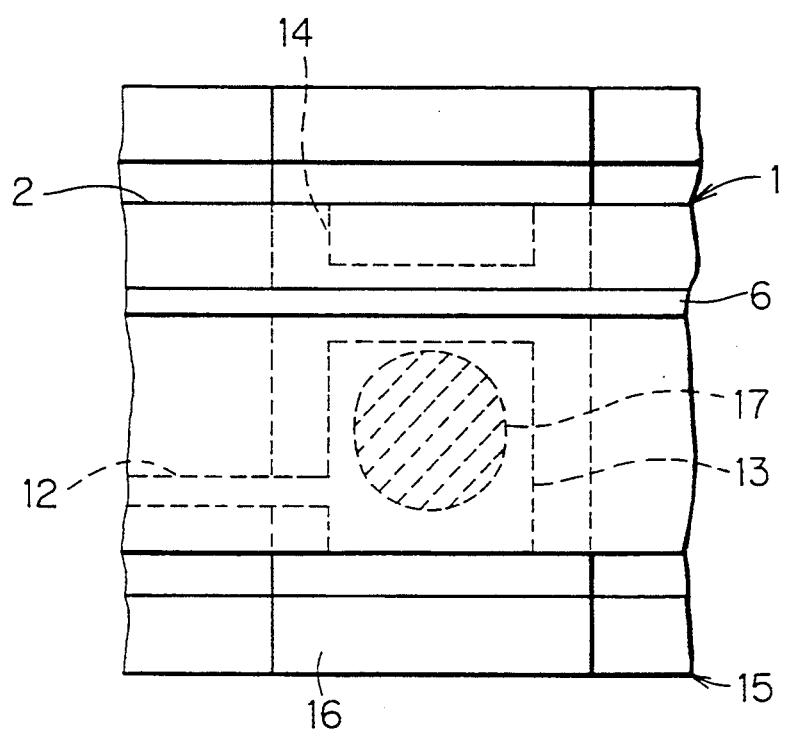
FIG. 3 is a partially enlarged top plan view showing a state corresponding to FIG. 2.
Figure 4:
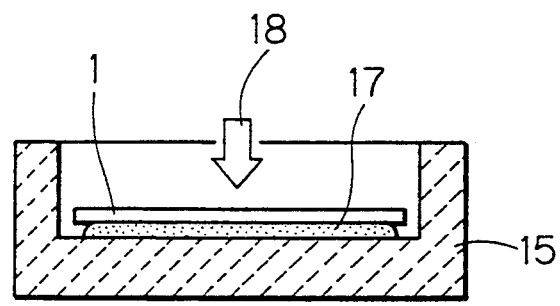
FIG. 4 is a sectional view showing a state of the piezo-resonator 1 shown in FIG. 2, which is pressed to spread the conductive adhesive 17 into a thin layer state.
Figure 5:
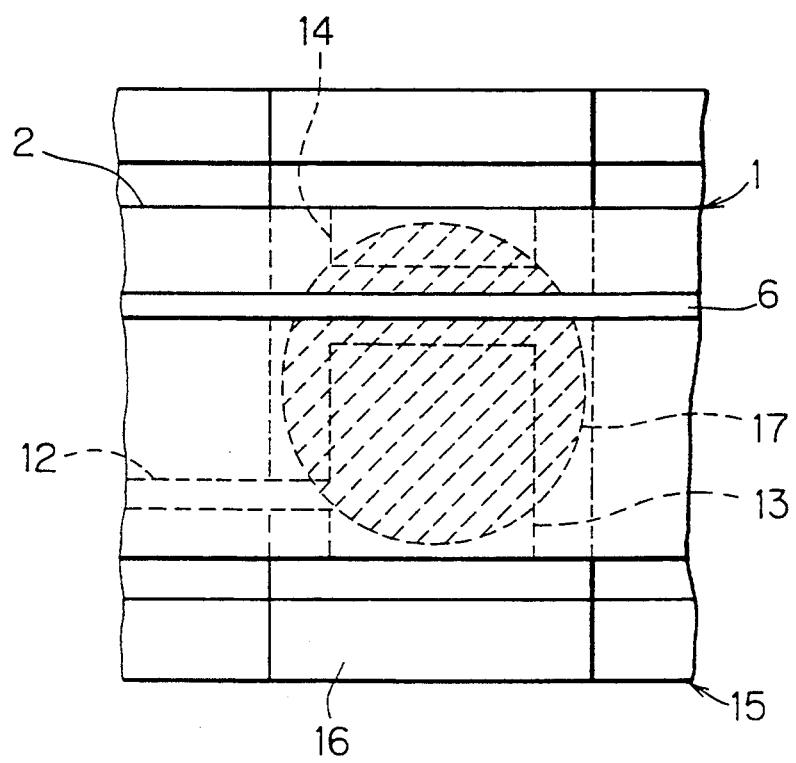
FIG. 5 is a partially enlarged top plan view showing a state corresponding to FIG. 4.

The piezo-resonator 1 is often stored in a ceramic case 15, to provide a practical product. At this time, the case 15 is provided with connection electrodes which are electrically connected with the terminal electrodes 7, 10 and 13, respectively. FIGS. 3 and 5 illustrate a connection electrode 16, which is connected with the earth terminal electrode 13. Such a connection electrode 16 is generally connected with the earth terminal electrode 13 through a conductive adhesive 17. As shown in FIGS. 2 and 3, the conductive adhesive 17 is spot-applied onto a prescribed portion of the connection electrode 16, and the piezo-resonator 1 is placed thereon. Then, pressure is applied to the piezo-resonator 1, along arrow 18 shown in FIG. 4, thereby spreading the conductive adhesive 17 to form a relatively thin layer between the earth terminal electrode 13 and the connection electrode 16, as shown in FIGS. 4 and 5.

Noting FIG. 5 in particular, it is understood that the conductive adhesive 17 extends across the first lead line 6. Thus, the conductive adhesive 17, which is electrically connected with the earth terminal electrode 13, is opposed to the first lead line 6, so as to cause undesired vibration in this portion.

Figure 6:
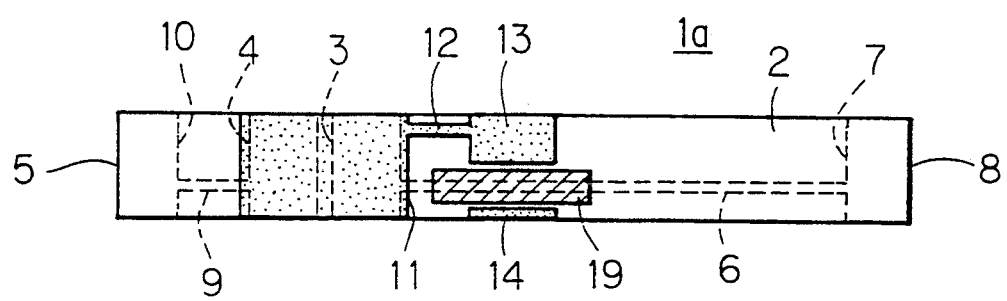
FIG. 6 is a plan view showing a piezo-resonator 1a according to another embodiment of the present invention.

FIG. 6 shows a piezo-resonator 1a forming a ceramic discriminator utilizing thickness shear vibration, which can solve the aforementioned problem. This piezo-resonator 1a comprises all the elements provided in the aforementioned piezo-resonator 1, shown in FIG. 1. Referring to FIG. 6, therefore, elements corresponding to those shown in FIG. 1 are denoted by similar reference numerals, to omit redundant description. As to the piezo-resonator 1a of this embodiment, FIG. 6 shows a surface of the piezo-resonator 1, which is opposite to the surface appearing in FIG. 1. In other words, a surface corresponding to the "second major surface" of the piezoelectric substrate 2 shown in FIG. 1 appears in FIG. 6. Referring to FIG. 6, therefore, solid lines show elements which are formed on the "second major surface" while broken lines show those formed on the "first major surface", respectively.

A feature of the piezo-resonator 1a shown in FIG. 6 resides in that an earth terminal electrode 13 is removed in a portion opposed to a first lead line 6, while an electric insulating film 19 is formed on the piezoelectric substrate 2 at the portion from which the earth terminal electrode 13 is removed. Such an insulating film 19 is formed by applying resin such as a resist ink or an adhesive in an unhardened stage, and then hardening the same, for example. The insulating film 19 prevents a conductive adhesive from adhering to the piezoelectric substrate 2 at the portion from which the earth terminal electrode 13 is removed.

Figure 7:
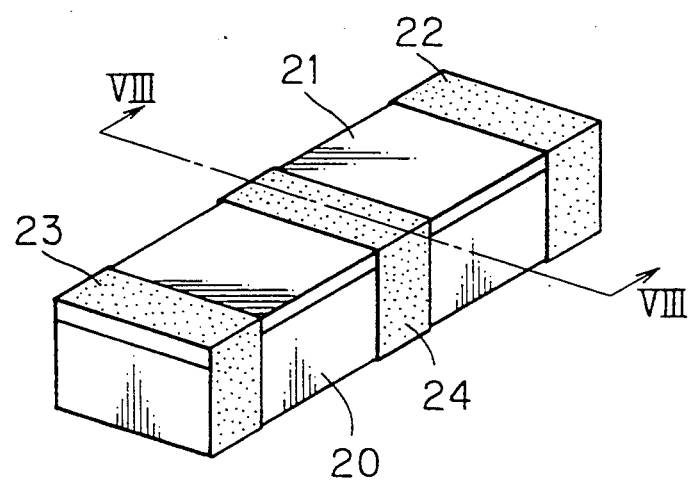
FIG. 7 is a perspective view showing a case 20 for storing the piezo-resonator 1a shown in FIG. 6.
Figure 8:
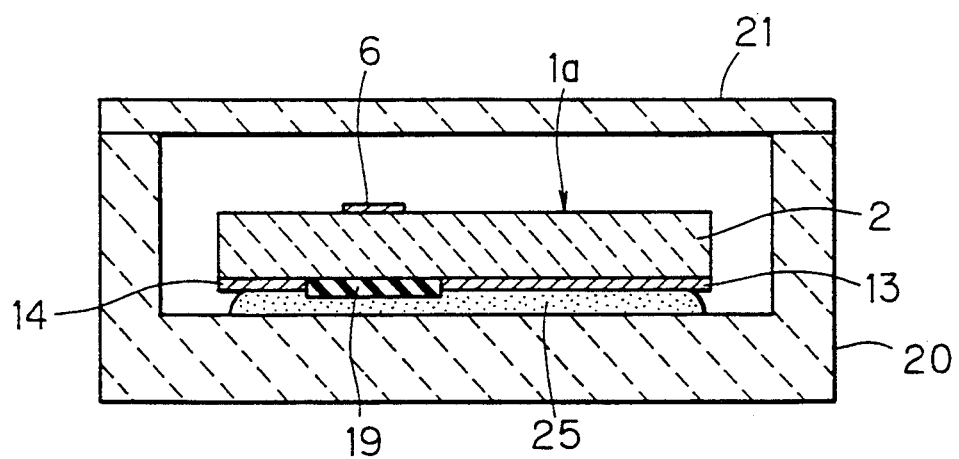
FIG. 8 is a sectional view taken along the line VIII—VIII in FIG. 7.

The piezo-resonator 1a shown in FIG. 6 is often stored in a ceramic case 20 as shown in FIGS. 7 and 8, to provide a practical product. The case 20 is closed with a cover 21, with external electrodes 22, 23 and 24 formed on the outer surfaces of the case 20 and the cover 21. The external electrodes 22, 23 and 24 are electrically connected to first and second terminal electrodes 7 and 10 and the earth terminal electrode 13, respectively, through connection electrodes (not shown) which are formed in the case 20.

FIG. 8 illustrates a section through the earth terminal electrode 13. When the earth terminal electrode 13 is electrically connected to the corresponding connection electrode (not shown) which is formed in the case 20, the insulating film 19 prevents a conductive adhesive 25 from adhesion onto the piezoelectric substrate 2 in a position opposed to the first lead line 6, as shown in FIG. 8. Thus, it is possible to suppress undesired vibration caused by the overlapping of the first lead line 6 and the conductive adhesive 25.

Figure 9:
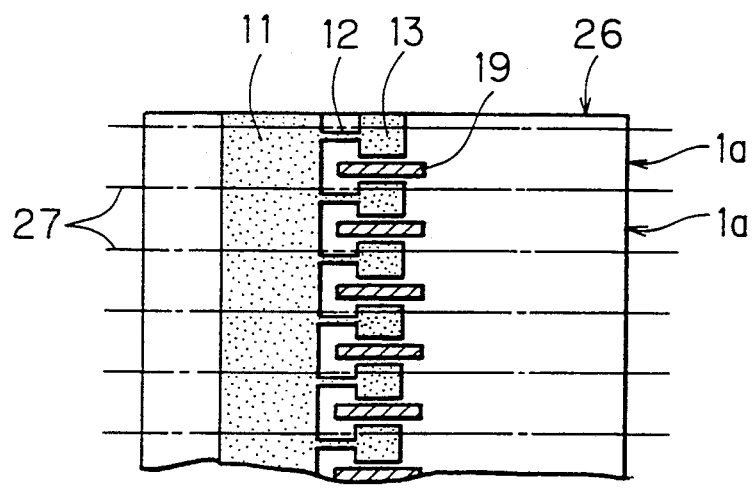
FIG. 9 is a plan view showing a mother piezoelectric substrate 26 which is prepared for obtaining the piezo-resonator 1a shown in FIG. 6.

FIG. 9 is a plan view showing a mother piezoelectric substrate 26 which is prepared for obtaining the piezo-resonator 1a shown in FIG. 6. This figure shows a surface which is provided with earth electrodes 11 and the like. Conductor films for defining the earth electrodes 11, earth lead lines 12 and earth terminal electrodes 13, and insulating films 19 are formed on the polarized mother piezoelectric substrate 26. Other conductor films are formed on another surface (not shown) of the mother piezoelectric substrate 26 for defining excitation electrodes 3 and 4, lead lines 6 and 9 and terminal electrodes 7 and 10. Then the mother substrate 26 is cut along cutting lines 27 shown by one-dot chain lines, thereby obtaining a plurality of piezo-resonators 1a.

Figure 10:
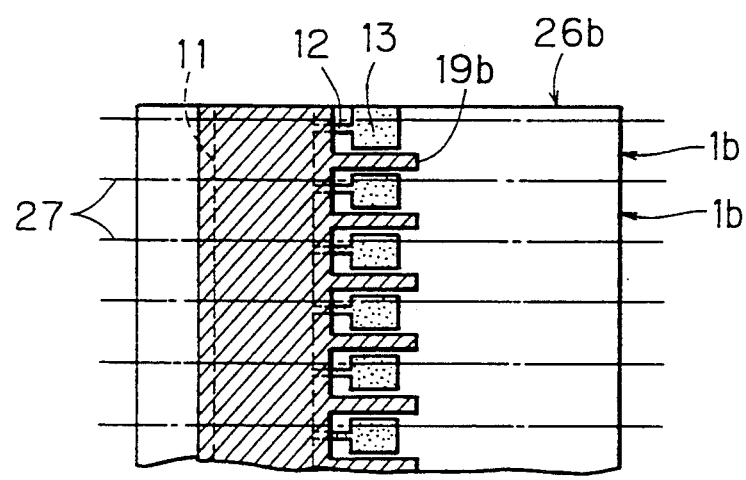
FIG. 10 is a plan view showing a mother piezoelectric substrate 26b which is prepared for obtaining piezo-resonators 1b according to still another embodiment of the present invention.

FIG. 10 is a plan view, corresponding to FIG. 9, showing a mother piezoelectric substrate 26b for obtaining piezo-resonators 1b according to still another embodiment of the present invention. According to this embodiment, insulating films 19b are formed to cover earth electrodes 11, and to also serve frequency regulation functions. Other aspects of this embodiment are similar to those of the embodiment shown in FIG. 6, and hence corresponding elements are denoted by similar reference numerals, to omit redundant description.

While the present invention has been described in relation to a discriminator, this invention is also applicable to a filter or the like.

Although the present invention has been described and illustrated in detail, it is clearly understood that the same is by way of illustration and example only and is not to be taken by way of limitation, the spirit and scope of the present invention being limited only by the terms of the appended claims.

What is claimed is:

1. A piezo-resonator utilizing thickness shear vibration, comprising:
   a piezoelectric substrate having an elongated rectangular shape with a first major surface and a second major surface thereof;
   first and second excitation electrodes formed on said first major surface of said piezoelectric substrate, said first and second excitation electrodes being formed on said first major surface at portions of said piezoelectric substrate that are closer to a first longitudinal end portion of said piezoelectric substrate than a predetermined portion of said piezoelectric substrate along the longitudinal direction thereof;

a first lead line being connected to said first excitation electrode and extending toward a second longitudinal end portion of said piezoelectric substrate while passing through said predetermined portion thereof;

a second lead line being connected to said second excitation electrode and extending toward said first longitudinal end portion of said piezoelectric substrate;

an earth electrode being formed on said second major surface of said piezoelectric substrate so as to be simultaneously opposed to both of said first and second excitation electrodes through said piezoelectric substrate;

an earth terminal electrode formed on said second major surface at said predetermined portion of said piezoelectric substrate and connected to said earth electrode through an earth lead line, said earth terminal electrode being spaced away from a portion of said second major surface directly opposite said first lead line so as to prevent said earth terminal electrode from being opposed to said first lead line through said piezoelectric substrate; and an electrically insulating film formed on said second major surface at said portion from which said earth terminal electrode is spaced away.

2. A piezo-resonator in accordance with claim 1, wherein said electrically insulating film is formed to cover said earth electrode.

* * * * *